US009941210B1

United States Patent
Viswanathan et al.

(10) Patent No.: US 9,941,210 B1
(45) Date of Patent: Apr. 10, 2018

(54) SEMICONDUCTOR DEVICES WITH PROTRUDING CONDUCTIVE VIAS AND METHODS OF MAKING SUCH DEVICES

(71) Applicant: NXP USA, Inc., Austin, TX (US)

(72) Inventors: Lakshminarayan Viswanathan, Phoenix, AZ (US); Jaynal A. Molla, Gilbert, AZ (US); Mali Mahalingam, Scottsdale, AZ (US); Colby Rampley, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/391,570

(22) Filed: Dec. 27, 2016

(51) Int. Cl.
*H01L 29/40* (2006.01)
*H01L 21/44* (2006.01)
*H01L 23/528* (2006.01)
*H01L 23/522* (2006.01)
*H01L 23/00* (2006.01)
*H01L 23/532* (2006.01)
*H01L 21/768* (2006.01)

(52) U.S. Cl.
CPC .... *H01L 23/5283* (2013.01); *H01L 21/76877* (2013.01); *H01L 23/5226* (2013.01); *H01L 23/53223* (2013.01); *H01L 23/53238* (2013.01); *H01L 23/53252* (2013.01); *H01L 23/53266* (2013.01); *H01L 24/16* (2013.01); *H01L 24/27* (2013.01); *H01L 24/32* (2013.01); *H01L 24/83* (2013.01)

(58) Field of Classification Search
CPC ............. H01L 21/486; H01L 21/76877; H01L 21/76898; H01L 23/49872; H01L 23/481; H01L 23/5226; H01L 23/528; H01L 23/5384; H01L 2225/06541; H01L 2225/06544; H01L 2225/06548; H01L 2224/02372; H01L 2224/83447
USPC .................. 438/675, 672, 667; 257/773–775
See application file for complete search history.

(56) References Cited

U.S. PATENT DOCUMENTS

| | | | |
|---|---|---|---|
| 8,779,605 B2 * | 7/2014 | Pratt | H01L 23/481 |
| | | | 257/621 |
| 9,401,323 B1 * | 7/2016 | Farooq | H01L 21/76898 |
| 9,653,381 B2 * | 5/2017 | Dando | H01L 23/481 |
| 2015/0014865 A1 | 1/2015 | Frueh et al. | |
| 2016/0099199 A1 | 4/2016 | Viswanathan et al. | |

* cited by examiner

*Primary Examiner* — Hsien Ming Lee
(74) *Attorney, Agent, or Firm* — Sherry W. Schumm (57) ABSTRACT

An embodiment of a semiconductor die includes a base semiconductor substrate and an electrically conductive through substrate via (TSV) extending between the surfaces of the base semiconductor substrate. The bottom surface of the base semiconductor substrate includes a recessed region proximate to the TSV so that an end of the TSV protrudes from the bottom surface, and so that the TSV sidewall has an exposed portion at the protruding end of the TSV. Back metal, consisting of one or more metallic layers, is deposited on the bottom surface of the base semiconductor substrate and in contact with the TSV. The back metal can include a gold layer, a sintered metallic layer, and/or a plurality of other conductive layers. The die may be attached to a substrate using solder, another sintered metallic layer, or other materials.

26 Claims, 7 Drawing Sheets

SEMICONDUCTOR DEVICES WITH PROTRUDING CONDUCTIVE VIAS AND METHODS OF MAKING SUCH DEVICES

TECHNICAL FIELD

This disclosure, in general, relates to semiconductor die that include conductive vias, devices made using such semiconductor die, and methods for making such semiconductor die and devices.

BACKGROUND

Semiconductor die are routinely connected to substrates and/or enclosed in semiconductor packages in order to electrically connect the semiconductor die to other system components. For example, commonly-used die attach methods include soldering the die to the substrate or to a package flange, connecting the die to the substrate or flange using a conductive or non-conductive adhesive, and performing eutectic die attach between the die and a metallic surface of the substrate or flange.

Some semiconductor die include conductive through substrate vias (TSVs), which provide electrical pathways between the bottom surface of the die and electrical components formed within or attached to a top surface of the die. Ends of the TSVs that are exposed at the bottom surface of the die may be physically and electrically coupled to conductive features on the top surface of the substrate and/or flange. This enables electrical signals and voltage references (e.g., ground references) to be provided at the interface between the bottom surface of the die and the top surface of the substrate or package flange.

As technology advances, an industry trend is to fabricate thinner and thinner semiconductor die. Although thinner die have a variety of benefits over their thicker counterparts, they also have a tendency to be weaker and more prone to cracking while performing various semiconductor fabrication processes. For example, high thermal and/or physical stresses, which may result in die cracking, may be imparted on a die while singulating the die from a wafer, during pick-and-place operations, and while performing the die attach process to a substrate or package flange. This problem is exacerbated by the inclusion of TSVs in the die, and also by microscopic flaws in the die bottom surface introduced during the wafer thinning process. Prolific die cracking can significantly reduce yields, detrimentally alter the performance of electrical components formed within the die, and increase the incidence of premature device failures in the field.

Accordingly, semiconductor device process engineers and device designers strive to develop stronger thin-die structures and fabrication methods that reduce the incidence of cracking in semiconductor die, and particularly in semiconductor die that include TSVs.

BRIEF DESCRIPTION OF THE DRAWINGS

A more complete understanding of the subject matter may be derived by referring to the detailed description and claims when considered in conjunction with the following figures, wherein like reference numbers refer to similar or identical elements throughout the figures.

DETAILED DESCRIPTION

Embodiments of semiconductor die, electronic devices that include such die, wafer and die fabrication techniques, and device fabrication techniques are described herein. The wafer and die fabrication embodiments may result in the production of semiconductor die that are stronger (e.g., less prone to cracking) and/or more robust (e.g., having higher yields, performance, and/or reliability) than die produced using more conventional methods. As will be discussed in more detail below, embodiments of semiconductor wafer and die fabrication techniques include recessing semiconductor material in proximity to the exposed ends of through substrate vias (TSVs) so that the TSV ends protrude from proximate surfaces of the semiconductor material.

Embodiments of semiconductor wafer and die fabrication processes also may include applying a sintered metallic layer and/or other material layers to the die surface at which the TSVs are protruding, in order to strengthen the die and to provide a robust electrical connection to the TSVs. Embodiments of these processes may result in the production of semiconductor wafers, semiconductor die, and semiconductor devices (e.g., packaged die or systems that include a substrate on which the die is mounted) with potentially higher yield, better and/or more predictable performance, and/or better reliability in the field.

As used herein, the terms "device" and "electronic device" may be used to refer to a semiconductor wafer that includes a plurality of semiconductor die that include at least one electrical component, to a semiconductor die with at least one electrical component, to a substrate or flange to which such a semiconductor die is coupled, and/or to an electronic system or discrete electronic component that includes such a semiconductor die coupled to a substrate or flange. In addition, the term "substrate" may be used to refer to a rigid body to which a semiconductor die is coupled, including a package flange and a rigid body formed from printed circuit board (PCB) materials.

Figure 1:
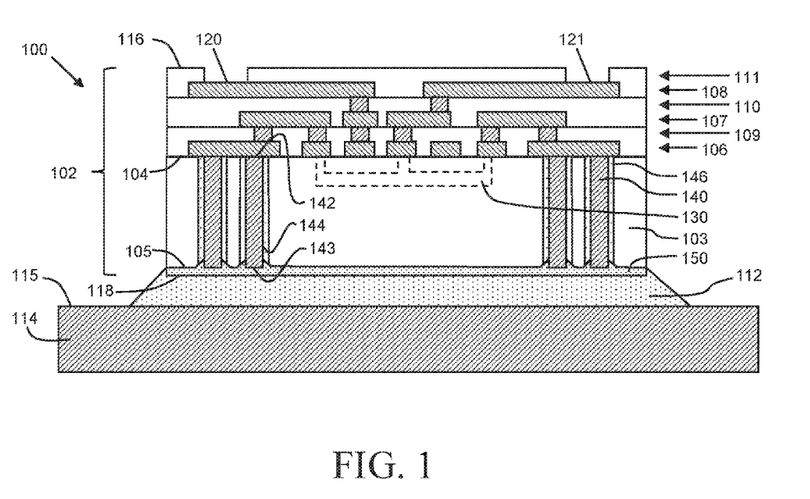
FIG. 1 is a cross-sectional, side view of a portion of a packaged semiconductor device, in accordance with an example embodiment.

FIG. 1 is a cross-sectional, side view of a portion of a packaged semiconductor device 100, in accordance with an example embodiment. The electronic device 100 includes a semiconductor die 102 having a top surface 116 and an opposed bottom surface 118, a substrate 114 with a conductive top surface 115, and a die attach material 112 that electrically and physically couples the bottom surface 118 of the semiconductor die 102 to the top surface 115 of the substrate 114. Note that the relative thicknesses of the die 102, die attach material 112, and substrate 114 may be significantly different from the thicknesses depicted in FIG. 1.

The semiconductor die 102 includes a base semiconductor substrate 103 formed of a semiconductor material, such as silicon, silicon carbide (SiC), silicon-on-insulator (SoI), silicon-on-sapphire (SoS), gallium nitride (GaN), gallium arsenide (GaAs), gallium nitride on silicon, gallium nitride on silicon carbide, gallium nitride on diamond, a diamond semiconductor, or another suitable semiconductor material. In some embodiments, the base semiconductor substrate 103 is a high-resistivity substrate with a bulk resistivity that is greater than 1000 ohm/centimeter. The base semiconductor substrate 103 may be formed from low-resistivity materials, in other embodiments. The base semiconductor substrate 103 has a first surface 104 below and parallel with the die top surface 116, and an opposed second surface 105.

The semiconductor die 102 also includes a plurality of alternating patterned conductive layers 106, 107, 108 and dielectric layers 109, 110, 110 formed over the first surface 104 of the base semiconductor substrate 103. The dielectric layers 109-110 electrically isolate portions of the conductive layers 106-108, and a plurality of conductive vias electrically connect other portions of the conductive layers 106-108 together. In addition, exposed portions of an uppermost conductive layer 108 may serve as conductive pads 120, 121 to which bondwires may be coupled, for example, for electrical connection with other electrical components of a device package or an electronic system. Although the embodiment illustrated in FIG. 1 depicts three patterned conductive layers 106-108 and three dielectric layers 109-110, other die may have more or fewer conductive and/or dielectric layers.

According to an embodiment, the semiconductor die 102 also includes one or more electrical components coupled thereto. For example, such an electrical component may include a transistor 130 that is integrally formed within the die 102, with doped semiconductor regions within the base semiconductor substrate 103 that correspond to source, drain, and channel regions of a field effect transistor (FET) (or equivalent regions in a bipolar junction transistor or in another type of transistor), and with other conductive elements providing a gate of the transistor. For example, through the various patterned conductive layers 106-108, the intervening conductive vias, and the conductive pads 120, 121, electrical signals may be provided to and from the transistor 130. In other embodiments, as will be described in more detail in conjunction with FIG. 12, a die may include other types of electrical components in addition to or instead of transistors, including but not limited to capacitors, inductors, resistors that are integrally formed within the die and/or physically connected to the die (e.g., connected to conductive pads at the top surface of the die). The electronic components (e.g., the source of transistor 130 or some other portion of a component) also may be electrically coupled to the second surface 105 of the base semiconductor substrate 103 through portions of the conductive layer(s) 106-108, the intervening conductive vias, and additional, electrically conductive through substrate vias (TSVs) 140, in an embodiment.

Each TSV 140 is formed from one or more conductive materials (e.g., tungsten, copper, aluminum, silver, gold, or other suitable materials), and extends between the first and second surfaces 104, 105 of the base semiconductor substrate 103. In some embodiments, a thin layer of electrically insulating material 146 (e.g., titanium, titanium nitride, tantalum, or another suitable insulator), alternatively referred to as a "glue layer" as it may promote adhesion of the TSV material, may be present between each TSV 140 and the material of the base semiconductor substrate 103. In an alternate embodiment, the insulating material 146 may be excluded, and the conductive material of the TSVs 140 may directly contact the semiconductor material of the base semiconductor substrate 103.

Each TSV 140 has a first end 142 proximate to the first surface 104 of the base semiconductor substrate 103, a second end 143 proximate to the second surface 105 of the base semiconductor substrate 103, and a TSV sidewall 144 extending between the first and second ends 142, 143 of the TSV 140. For example, the first end 142 of a TSV 140 may be electrically connected to an electronic component (e.g., transistor 130) through portions of one or more of the conductive layer(s) 106-108 and intervening conductive vias.

As will be explained in more detail later in conjunction with FIGS. 5-9, the second surface 105 of the base semiconductor substrate 103 includes a recessed region (e.g., regions 610, 810, FIGS. 5-9) proximate to each TSV 140 so that the second end 143 of the TSV 140 protrudes from the second surface 105, and so that the TSV sidewall 144 has an exposed portion at the second end 143 of the TSV 140.

As mentioned above, the TSVs 140 may form a portion of an electrical path between an electronic component and the second surface 105 of the base semiconductor substrate 103. For example, when the second surface 105 of the base semiconductor substrate 103 is connected to a voltage reference (e.g., a ground reference), the TSVs 140 enable the electronic component to be electrically coupled to the voltage reference through the base semiconductor substrate 103. In other embodiments, TSVs 140 may be used for other purposes, such as for providing electrical connections configured to convey information-carrying signals, and/or for facilitating the transfer of heat from heat-producing components integrated within the die 102 to the second surface 105 of the base semiconductor substrate 103. In such embodiments, the second surface 105 may be electrically coupled to signal-carrying pads on the substrate 114, or the substrate 114 may function as a heat sink for the device 100.

As will be described in more detail in conjunction with FIG. 10, the semiconductor die 102 also may include one or more electrically conductive layers, collectively referred to as "backside metal" and indicated with reference number 150 in FIG. 1, which are connected to the second surface 105 of the base semiconductor substrate 103 and to the aforementioned exposed portions of the TSV sidewalls 144 (i.e., the portions of the TSV sidewalls 144 that are exposed at the second ends 143 of the TSVs 140). The backside metal 150 fills in recessed regions (e.g., regions 610, 810, FIGS. 6-9) in the base semiconductor substrate 103 that are proximate to the exposed TSVs 140, and directly contacts the exposed portions of the TSV sidewalls 144. The direct contact between the TSV sidewalls 144 and the backside metal 150 may provide improved electrical contact between the TSVs 140 and the backside metal 150. In addition, the backside metal 150 may significantly increase the strength of the die 102, thus reducing the likelihood of die cracking and associated loss of functionality or performance.

For example, the conductive layer(s) 150 may include one or more layers of conductive materials selected from silver, gold, palladium, copper, nickel, titanium, nickel-vanadium, other suitable materials, and any of various combinations thereof. In some embodiments, one of the layer(s) 150 may include a sintered metallic layer formed from silver, gold, palladium, copper, nickel, or a combination thereof. According to one embodiment, the backside metal 150 may cover an entirety of the surface 105 of the base semiconductor substrate 103, or the backside metal 150 may be patterned to leave some portions of the surface 105 exposed, in other embodiments.

The outside surface of the electrically conductive layer(s) 150 (or the second surface of the base semiconductor substrate 103, when layer(s) 150 are excluded) corresponds to the bottom surface 118 of the semiconductor die 102. According to an embodiment, the semiconductor die 102 can have a thickness (between surfaces 116, 118) in a range of about 10 microns to about 500 microns, such as a range of about 40 microns to about 200 microns, or a range of about 75 microns to about 125 microns. The semiconductor die 102 may be thinner or thicker than the above-given ranges, in other embodiments.

According to an embodiment, conductive die attach material 112 electrically and physically couples the semiconductor die 102 to the conductive top surface 115 of the substrate 114. In various embodiments, the die attach material 112 may include a sintered metallic layer, a solder layer, a conductive adhesive layer (e.g., a conductive epoxy), or another suitable die attach material.

Die attach material 112 is applied during the process of attaching the semiconductor die 102 to the conductive top surface 115 of the substrate 114. For example, the die attach material 112 can take the form of a flowable material that hardens, or a material that merely hardens without becoming flowable, such as a film or paste. For example, the die attach material 112 can be formed of a polymeric material configured to harden after application, such as a conductive epoxy. In another example, the die attach material 112 can be formed of a solder material that is melted during the die attach process. In a particular example, the die attach material 112 is formed of a solder material having a melting point in a range of about 110° C. to about 380° C. For example, suitable solder materials may be selected from an alloy or amalgam of metals or semi-metals, such as lead, tin, gold, silver, copper, zinc, antimony, gold, phosphorus, bismuth, indium, cadmium, aluminum, silicon, germanium, or any suitable combination thereof. In some embodiments, the solder material may include a lead free solder, such as a gold-silicon solder or a gold-tin solder. In other embodiments, the solder may include a lead-tin-silver solder.

In other embodiments, the die attach material 112 can be formed from a sinterable material that includes particulate metal materials. Optionally, the sinterable material also may include flux, polymer binders, distributors, and/or thinners. The particulate metal materials may have particle sizes in a range of about 10 nanometers (nm) to about 100 microns, such as a range of about 100 nm to about 50 microns or a range of about 1 microns to about 20 microns. In response to performing a sintering process, the particles of the die attach material 112 and the conductive top surface 115 of the substrate 114 bind together to form a solid structure. Similarly, the particles of the die attach material 112 and the conductive layer(s) 150 bind together to form a solid structure.

In the above example embodiment, the die attach material 112 can be a sinterable, conductive film or paste. For example, the die attach material 112 can include one or more particulate metals selected from silver particles, gold particles, palladium particles, copper particles, nickel particles, or combinations thereof. In a particular example embodiment, the die attach material 112 includes silver particles, and the die attach material 112 is a sinterable silver paste or film. The die attach material 112 may also include non-metallic particulate matter, such as diamond, silicon carbide, boron nitride, or combinations thereof.

Between the bottom surface 118 of the semiconductor die 102 and the top surface 115 of the substrate 114, the die attach material 112 may have a thickness in a range of about 5 microns to about 100 microns, although the die attach material 112 could be thinner or thicker, as well. For example, the thickness of the die attach material 112 may be in a range of about 15 microns to about 40 microns, such as a range of about 15 microns to about 30 microns. The die attach material 112 may be applied to the full bottom surface 118 of the semiconductor die 102, or the die attach material 112 may be applied only partially to the bottom surface 118, such as in a pattern.

Substrate 114 is a rigid structure to which the semiconductor die 102 is coupled. According to an embodiment, substrate includes a conductive top surface 115, and in some further embodiments, an entirety of substrate 114 may be formed from one or more conductive materials. For example, substrate 114 may be a flange that forms a portion of a lead frame, and the flange may be formed from bulk conductive material (e.g., copper, iron nickel alloy, nickel cobalt iron alloy, a combination thereof, or some other suitable material(s)). Alternatively, substrate 114 may be a conductive "coin" that may be press-fit into, or otherwise attached to another substrate. Either way, the top surface 115 of substrate 114 may be plated, or may be free from plating, in various embodiments. As still another example, substrate 114 may be a PCB with a conductive top surface 115. In the various embodiments, the substrate 114 may function to provide voltage reference(s) (e.g., a ground reference) and/or information-carrying signals to the semiconductor die 102. In addition, the substrate 114 may be configured to act as a thermal heat sink for heat generated within the semiconductor die 102 during operation.

Figure 2:
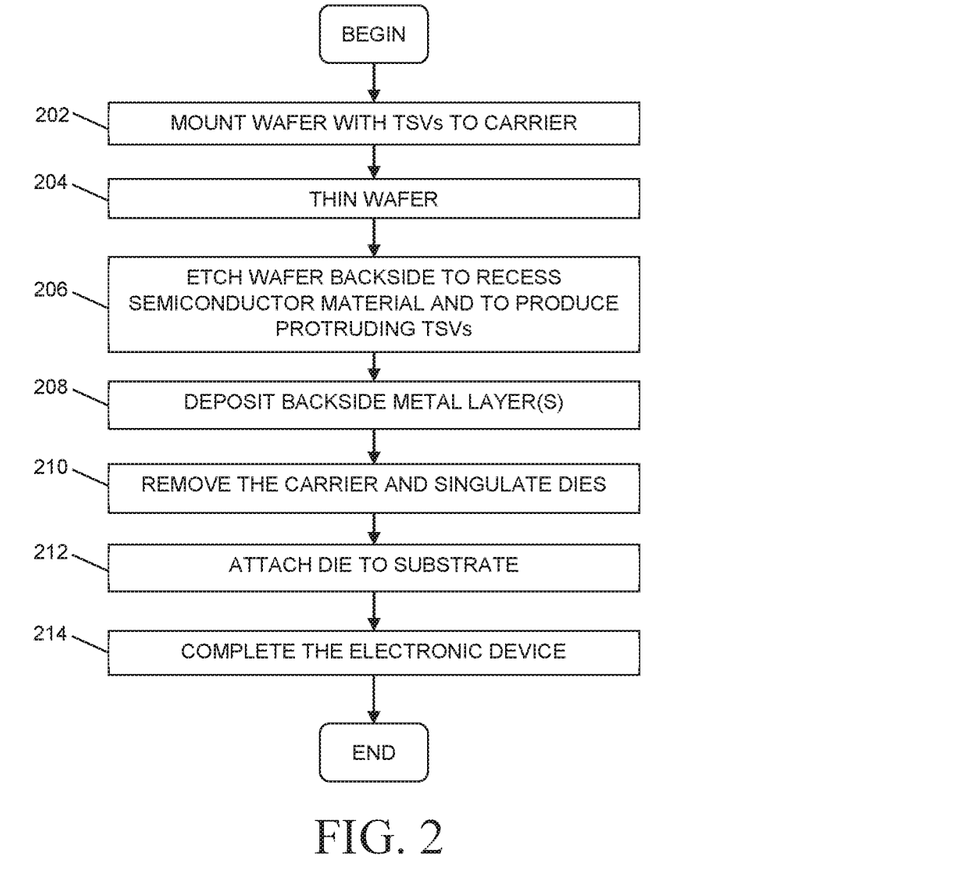
FIG. 2 is a flowchart of a method for fabricating a semiconductor wafer, semiconductor die, and semiconductor device in accordance with an example embodiment.
Figure 8:
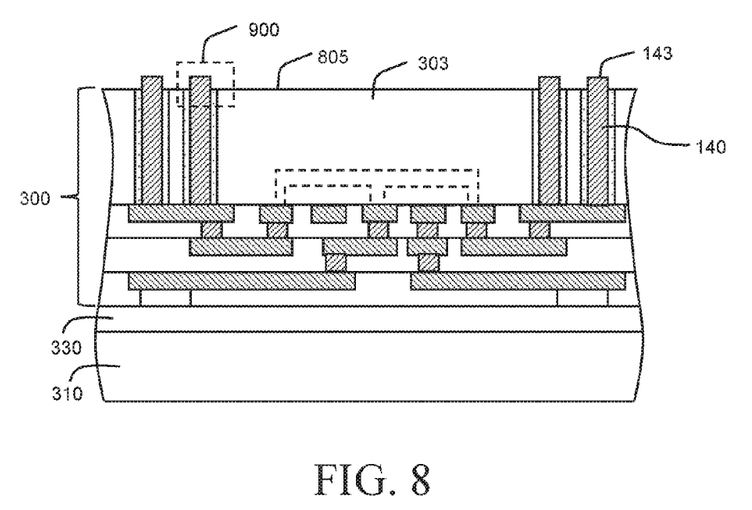
FIG. 8 is a cross-sectional, side view of a portion of a semiconductor wafer after an etching process, in accordance with another example embodiment.
Figure 9:
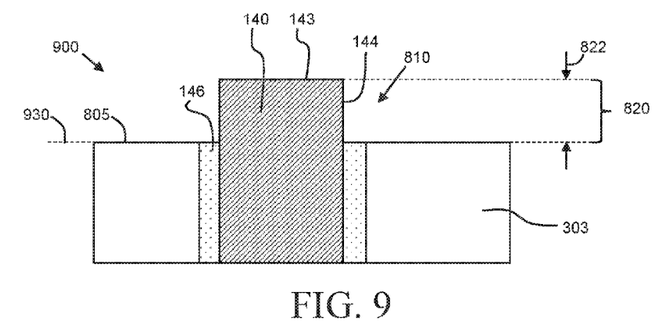
FIG. 9 is an enlarged side view of a protruding via in the semiconductor wafer of FIG. 8, in accordance with another example embodiment.

FIG. 2 is a flowchart of a method for fabricating a semiconductor wafer (e.g., wafer 300, FIGS. 3-5, 8, and 10), a semiconductor die (e.g., die 102, 1102, 1202, FIGS. 1, 11, 12), and a semiconductor device (e.g., device 100, FIG. 1) in accordance with an example embodiment. FIG. 2 should be viewed in conjunction with FIGS. 3-11, which illustrate various views of a semiconductor wafer 300 and a semiconductor die 1102 during various stages of fabrication. More particularly, FIGS. 3-5, 8, and 10 are cross-sectional, side views of a portion of a semiconductor wafer 300 at several stages of fabrication, FIGS. 6, 7, and 9 are enlarged side and top views of embodiments of protruding TSVs 140 in a semiconductor die, and FIG. 11 is a cross-sectional, side view of a semiconductor die 1102, in accordance with various example embodiments. Each of FIGS. 3-11 will be referred to in turn during discussion of corresponding fabrication steps depicted in FIG. 2. It should be noted that, in FIGS. 3-5, 8, and 10, only portions of a wafer 300 and carrier 310 are depicted, as indicated with curved lines at the left and right sides of the drawings. In actuality, the wafer 300 may include numerous additional devices that are not depicted in the drawings to more clearly depict the inventive subject matter. In addition, the carrier 310 would be significantly wider than depicted in the drawings in order to accommodate the entire wafer 300.

Figure 3:
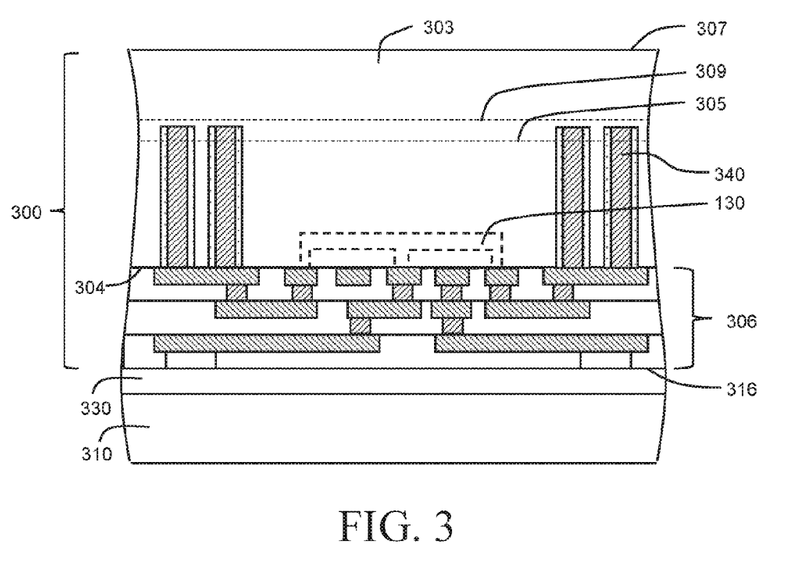
FIGS. 3-5 are cross-sectional, side views of a portion of a semiconductor wafer at several stages of fabrication, in accordance with an example embodiment.

Referring first to FIG. 3 and block 202 (FIG. 2), an embodiment of a method for fabricating a semiconductor wafer 300 may begin by mounting a wafer 300 with first and second opposed surfaces 316, 307 to a wafer support carrier 310. For example, the semiconductor wafer 300 may be mounted to the wafer support carrier 310 using an adhesive layer 330 between a first surface 316 of the wafer 300 and the wafer support carrier 310. A carrier release layer (not shown for simplicity) also may be present between the adhesive layer 330 and the wafer support carrier 310.

The wafer 300 may, for example, include multiple instantiations of a die (e.g., die 110, FIG. 1) before each instantiation of the die has been singulated from the wafer 300. For the purpose of example, the process depicted in FIGS. 3-11 corresponds to the fabrication of die 110, FIG. 1, and corresponding elements of die 110 are provided throughout the description of the fabrication method. In FIGS. 3-10, the orientation of the die elements are flipped from the orientation of die 110 shown in FIG. 1. Said another way, the die 110, FIG. 1, may be a constituent part of wafer 300, but the orientation of the die 110 within wafer 300 is upside-down in FIGS. 3-10, when compared with the orientation of the die 110 shown in FIG. 1.

Using corresponding elements of die 100 (FIG. 1) as an example, the wafer 300 may include a base semiconductor wafer 303 (e.g., from which base semiconductor substrate 103, FIG. 1, ultimately is produced), a plurality of conductive and dielectric layers 306 formed on a surface 304 of the base semiconductor wafer 303 (e.g., from which layers 106-111, FIG. 1, ultimately are produced), a plurality of electronic devices 130 (e.g., transistor 130, FIG. 1 or other devices), and a plurality of TSVs 340 (e.g., from which TSVs 140, FIG. 1, ultimately are produced).

Figure 4:
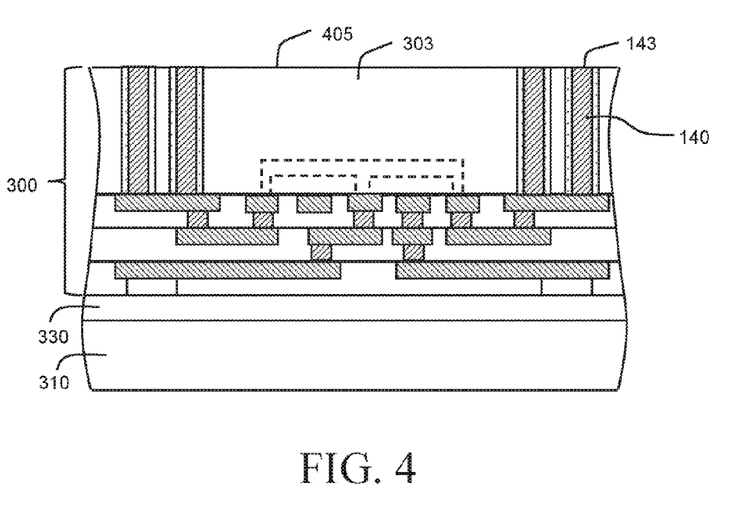

Referring next to FIG. 4 and block 204 (FIG. 2), the wafer 300 may be thinned, in block 204, to expose a third wafer surface 405 (e.g., corresponding to base semiconductor surface 105, FIG. 1) by removing a quantity of sacrificial semiconductor material from the "backside" of the wafer 300. For example, the wafer thinning process may include performing a backgrinding operation with a mechanical grinding wheel that thins the wafer 300 to a reduced thickness. An optional etching process may then be performed to clean the ground surface 405 of the wafer (e.g., to remove additional semiconductor material from the backside of the wafer 300 and to reduce or eliminate subsurface microdamage created by the grinding wheel). For example, the reduced thickness of the wafer 300 may be in a range of about 40 microns to about 125 microns, although the reduced thickness may be smaller or larger, as well.

Referring again briefly to FIG. 3, for example, the sacrificial semiconductor material removed from the wafer 300 through backgrinding may correspond to material between dashed line 305 and the second surface 307 of the wafer 300. As can be seen in FIG. 3, the original TSVs 340 may have lengths sufficient to extend into the area of sacrificial semiconductor material, but not sufficient to extend all the way to surface 307. Accordingly, referring again to FIG. 4, the wafer thinning process of block 204 may result in the production of shortened TSVs 140 (e.g., corresponding to TSVs 140, FIG. 1) with ends 143 that are exposed to the environment (e.g., corresponding to TSV ends 143, FIG. 1). In an alternate embodiment, the wafer thinning process of block 204 may be stopped at a point before the TSVs 340 become exposed. For example, the wafer thinning process may be carried out to remove material between dashed line 309 and the second surface 307 of the wafer 300. In such an embodiment, the ends of the TSVs 340 remain recessed below the newly-exposed surface of the base semiconductor wafer 303, and subsequent etching processes (e.g., as performed in block 206, described below) may be used to expose the ends of the TSVs 340.

In block 206 (FIG. 2), an etching process may then be performed on the wafer surface 405 (i.e., the current wafer backside), in an embodiment, to at least partially remove damage to the wafer surface 405 resulting from the backgrinding process (e.g., scoring imparted by the grinding wheel), and to recess at least those portions of the base semiconductor wafer 303 that are proximate to the TSVs 140. One example result that may be achieved by performing an embodiment of the etching process of block 206 is shown in FIGS. 5-7, and another example result that may be achieved by performing another embodiment of the etching process of block 206 is shown in FIGS. 8 and 9.

According to the first example embodiment, the etching process of block 206 may include a wet etching process. FIGS. 5-7 illustrate a result that may be achieved using this first example embodiment. More specifically, FIG. 5 is a cross-sectional, side view of a portion of a semiconductor wafer 300 after a wet etching process, in accordance with an example embodiment. To more clearly illustrate the result achieved with the wet etching process, a portion of an exposed end 143 of a TSV 140 enclosed by dashed box 600 in FIG. 5, is enlarged in FIG. 6 to better show various features. A top view of the enlarged TSV 140 of FIG. 6 is shown in FIG. 7. As shown in the top view of FIG. 7, a TSV 140 may have an elongated cross sectional shape, with a length 720 in a range of about 25 microns to about 30 microns, and a width 722 in a range of about 2.0 microns to about 3.0 microns, for example. In other embodiments, an elongated TSV may have larger or smaller length and/or width, or a TSV may have a circular cross-sectional shape, a donut cross-sectional shape, or another cross-sectional shape.

Figure 5:
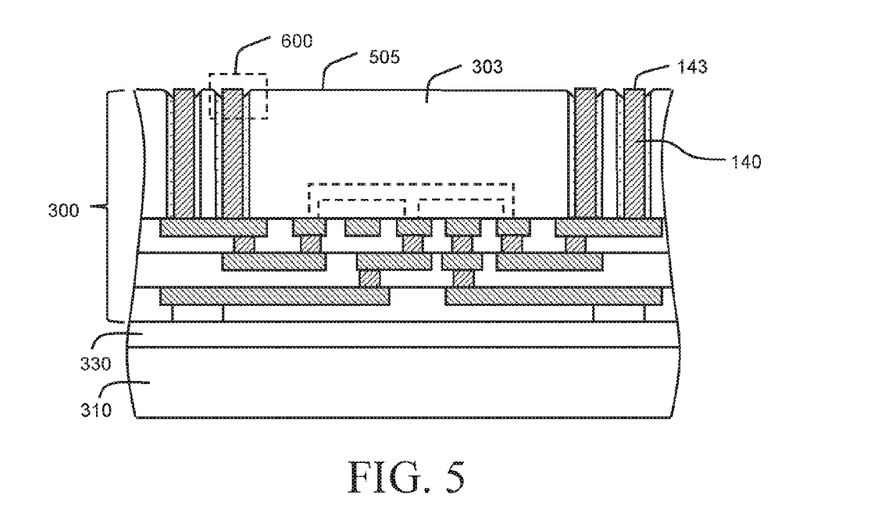
Figure 6:
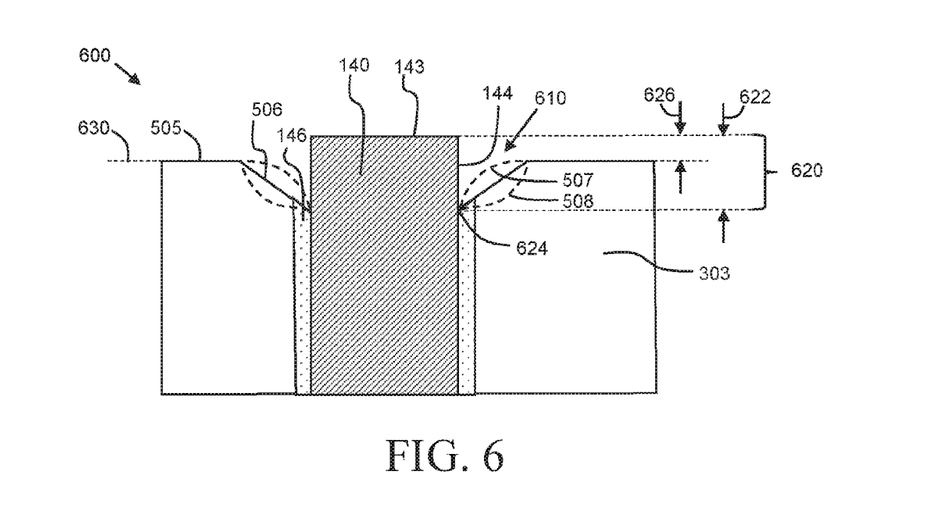
FIGS. 6 and 7 are enlarged side and top views, respectively, of a protruding via in the semiconductor wafer of FIG. 5, in accordance with an example embodiment.
Figure 7:
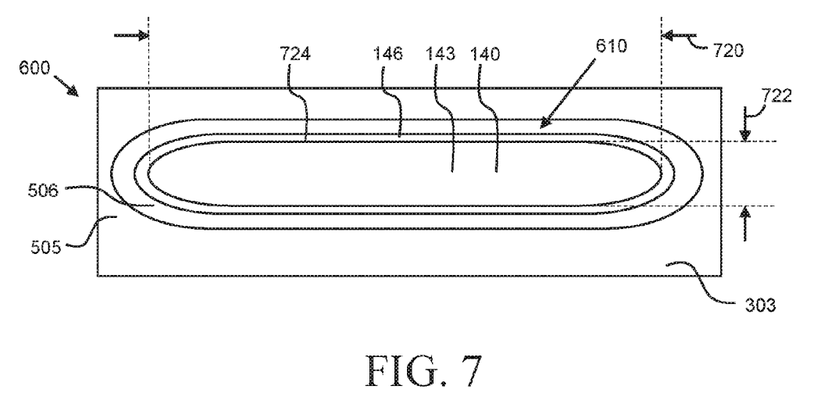

Referring simultaneously to FIGS. 5-7, a first example embodiment of the etching process of block 206 may remove additional semiconductor material from the base semiconductor wafer 303 to expose a fourth wafer surface 505. As can be seen most clearly in FIG. 6, the etching process results in a configuration in which the end 143 of the TSV 140 protrudes from the surface 505 of the base semiconductor wafer 303. According to an embodiment, the etching process causes the formation of a recessed region 610 of the base semiconductor wafer 303 that is proximate to the TSV 140, and the end 143 of the TSV 140 protrudes from the surface 505 of the base semiconductor wafer 303 in the recessed region 610. More specifically, the etching process removes a portion of the base semiconductor wafer 303 proximate to the TSV 140 to produce an exposed portion 620 of the TSV sidewall 144 at the end 143 of the TSV 140. According to an embodiment, the height 622 of the exposed portion 620 of the TSV sidewall 144 is in a range of about 2.0 microns to about 15.0 microns, such as in a range between about 5.0 microns to about 10.0 microns, although the height 622 may be smaller or larger, as well.

In the embodiment illustrated in FIGS. 5-7, a majority of the surface 505 of the base semiconductor wafer 303 extends along a primary plane, represented by dashed line 630 in FIG. 6, which is perpendicular to the length of the TSVs 140 (i.e., a horizontal plane in FIGS. 5 and 6, and the plane of the page in FIG. 7). Due to the preferential nature of the etching process to the semiconductor material of the base semiconductor wafer 303, the horizontal plane 630 is below the ends 143 of the TSVs 140, in an embodiment. For example, the TSVs 140 may protrude above the horizontal plane 630 by a distance 626 in a range of about 0.5 microns to about 5 microns, although the TSVs 140 may protrude above the plane 630 by a smaller or greater distance, as well. According to an embodiment, the recessed region 610 is defined by a portion 506 of the surface 505 that extends from the primary plane 630 downward (i.e., toward the opposed surface 304 of the base semiconductor wafer 303) to a deepest exposed point 624 on a circumference 724 (FIG. 7) of the TSV sidewall 144. The portion 506 of the surface 505 may be substantially linear in side view, as shown. Alternatively, the portion of the surface 506 that extends from the primary plane 630 toward the deepest exposed point 624 may have a convex profile or a concave profile, as indicated with dashed lines 507, 508, respectively.

The angled surface profile 506-508 may be achieved by selecting an etching compound that removes the material of the base semiconductor wafer 303 from every surface that is exposed to the etching compound, but that also removes the material of the base semiconductor wafer 303 more preferentially near the TSVs 140. Essentially, the material of the TSV 140 acts as an anode during the etching process, which helps to drive the etching reaction in proximity to the TSV 140. As mentioned previously in conjunction with FIG. 1, a thin layer of electrically insulating material 146 may be present between each TSV 140 and the material of the base semiconductor wafer 303. In some embodiments, exposure to the etching compound also may etch away portions of the insulating material 146 proximate to the end 143 of the TSVs 140, as shown in FIG. 6. In other embodiments, the etch chemistry may not be particularly selective to the insulating material 146, and some or all of the insulating material 146 may remain on the protruding portion of the TSV 140. In still other embodiments, the insulating material 146 may be excluded, and the conductive material of the TSVs 140 may directly contact the semiconductor material of the base semiconductor wafer 303.

According to an embodiment, a wet etching process of block 206 may include spraying an anisotropic wet etching compound (or "selective wet etch chemistry") on the wafer surface 405 (FIG. 4) while rotating the wafer 300. For example, the etching compound may include a concentrated acid solution (e.g., a concentrated fluorinated acid, such as nitric acid plus hydrofluoric acid, or hydrochloric acid plus nitric acid plus water), a diluted acid solution (e.g., diluted citric acid plus hydrogen peroxide plus water), an ammonium salt, a hydroxide (e.g., tetramethylammonium hydroxide (TMAH) or potassium hydroxide (KOH)), a solution of ethylene diamine and procatechol (EDP), or another suitable etching compound that causes the semiconductor material of the base semiconductor substrate 303 to be etched at a higher rate than the conductive material (e.g., tungsten, copper, aluminum, silver, gold, or other suitable materials) of the TSVs 140.

According to some embodiments, the chemistry of the etching compound may be selected so that it causes the conductive material of the TSVs 140 to passivate, in which case the conductive material etches at a slower rate than the semiconductor material of the base semiconductor wafer 303. In other embodiments, the chemistry of the etching compound is selected so that it preferentially etches the semiconductor material of the base semiconductor wafer 303, in comparison to the etching rate of the conductive material of the TSVs 140.

The duration of the etching process depends on the chemistry of the etching compound and the desired height 622 of the exposed portion 620 of the TSV sidewalls 144. In addition, the etching process may be a heated process or an unheated process (i.e., performed at ambient temperature). For example, for a selective wet etch chemistry that includes a concentrated fluorinated acid, the etching process may be performed at ambient temperature, and the duration of the etching process may be on the order of seconds (e.g., from 5-20 seconds, more or less). As another example, for a selective wet etch chemistry that includes TMAH, the etching process may be performed at an elevated temperature (e.g., between about 35 degrees Celsius and about 45 degrees Celsius, more or less), and the duration of the etching process may be on the order of minutes (e.g., from 5-20 minutes, more or less).

Another example result that may be achieved by performing an alternate embodiment of the etching process of block 206 is shown in FIGS. 8 and 9. According to an embodiment, instead of performing a wet etching process as described in conjunction with FIGS. 5-7, an alternate embodiment may include performing a dry etching process, which is isotropic in nature. FIG. 8 is a cross-sectional, side view of a portion of a semiconductor wafer 300 after a dry etching process, in accordance with an example embodiment. To more clearly illustrate the result achieved with the dry etching process, a portion of an exposed end 143 of a TSV 140 enclosed by dashed box 900 in FIG. 8, is enlarged in FIG. 9 to better show various features.

Referring simultaneously to FIGS. 8 and 9, another example embodiment of the etching process of block 206 may remove additional semiconductor material from the base semiconductor wafer 303 to expose a fifth wafer surface 805. As can be seen most clearly in FIG. 9, the etching process once again results in a configuration in which the end 143 of the TSV 140 protrudes from the surface 805 of the base semiconductor wafer 303. In other words, as with the embodiment illustrated in FIGS. 5-7, the dry etching process also causes the formation of a recessed region 810 of the base semiconductor wafer 303 that is proximate to the TSV 140, and the end 143 of the TSV 140 protrudes from the surface 805 of the base semiconductor wafer 303 in the recessed region 810. However, in contrast with the embodiment illustrated in FIGS. 5-7, the dry etching process does not preferentially remove material of the base semiconductor wafer 303 in proximity to the TSV 140. Instead, the dry etching process removes material of the base semiconductor wafer 303 at a substantially equal rate across the entire exposed surface of the base semiconductor wafer 303. As with the previously-described embodiments, the dry etching process also results in an exposed portion 820 of the TSV sidewall 144 at the end 143 of the TSV 140. For example, the height 822 of the exposed portion 820 of the TSV sidewall 144 may be in a range of about 2.0 microns to about 15.0 microns, such as in a range between about 5.0 microns to about 10.0 microns, although the height 822 may be smaller or larger, as well.

In the embodiment illustrated in FIGS. 8 and 9, substantially all of the surface 805 of the base semiconductor wafer 303 extends along a primary plane, represented by dashed line 930 in FIG. 9, which is perpendicular to the length of the TSVs 140 (i.e., a horizontal plane in FIGS. 8 and 9). Due to the preferential nature of the etching process to the semiconductor material of the base semiconductor wafer 303, the horizontal plane 930 is below the ends 143 of the TSVs 140. Once again, the TSVs 140 protrude above the horizontal plane 930.

As previously discussed, in some embodiments, a thin layer of electrically insulating material 146 may be present between each TSV 140 and the material of the base semiconductor wafer 303. The dry etching process also may etch away portions of the insulating material 146 proximate to the end 143 of the TSVs 140, as shown in FIG. 9. In other embodiments, the dry etching process may be performed in a manner that results in some or all of the insulating material 146 remaining on the protruding portion of the TSV 140. In still other embodiments, the insulating material 146 may be excluded.

According to an embodiment, a dry etching process of block 206 may include plasma etching, reactive ion etching, a combination thereof, or another suitable dry etching technique. In addition or alternatively, laser assisted plasma enhanced chemical vapor deposition (LAPECVD) may be used to remove some or all of the semiconductor material. In an embodiment in which plasma etching is performed, a plasma etcher may be used to produce energetic free radicals, neutrally charged, which react at the surface of the base semiconductor wafer 303. The source gas for the plasma may include molecules rich in chlorine or fluorine. For example, the source gas may include molecules of dichlor, carbon tetrachloride, silicon tetrachloride, boron tetrachloride, dichlorodifluoromethane, tetrafluoromethane, sulfur hexafluoride, nitrogen trifluoride, or other suitable molecules. The duration of the etching process depends on the desired height 822 of the exposed portion 820 of the TSV sidewalls 144.

Referring again to FIG. 2, after the etching process of block 206, which results in the production of TSVs 140 that protrude above the surface of the surrounding base semiconductor wafer 303, one or more layers of backside metal 150 are deposited on the exposed surface of the base semiconductor wafer 303 in block 208. For example, FIG. 10 is a cross-sectional, side view of a portion of a semiconductor wafer 300 after deposition of one or more layers of backside metal 150, in accordance with several example embodiments. FIG. 10 particularly shows three example configurations of backside metal 150 in enlarged view. A first example is a single-layer configuration, shown as an enlarged portion of the wafer 300 surrounded by box 1010. A second example is a multi-layer configuration, shown as an enlarged portion of the wafer 300 surrounded by box 1020. A third example is a two-layer configuration, shown as an enlarged portion of the wafer 300 surrounded by box 1030. The layer(s) comprising the backside metal 150 may be deposited using a variety of deposition techniques. For example, the layer(s) of backside metal 150 can be deposited by chemical vapor deposition (CVD), physical vapor deposition (PVD) (e.g., sputtering), plating, sintering or a combination thereof.

Figure 10:
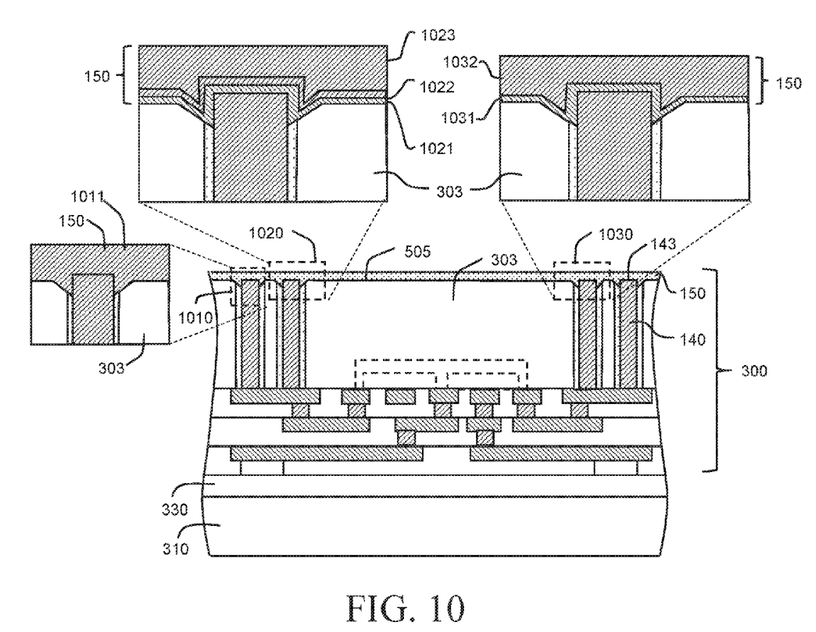
FIG. 10 is a cross-sectional, side view of a portion of a semiconductor wafer at another stage of fabrication, in accordance with an example embodiment.
Figure 11:
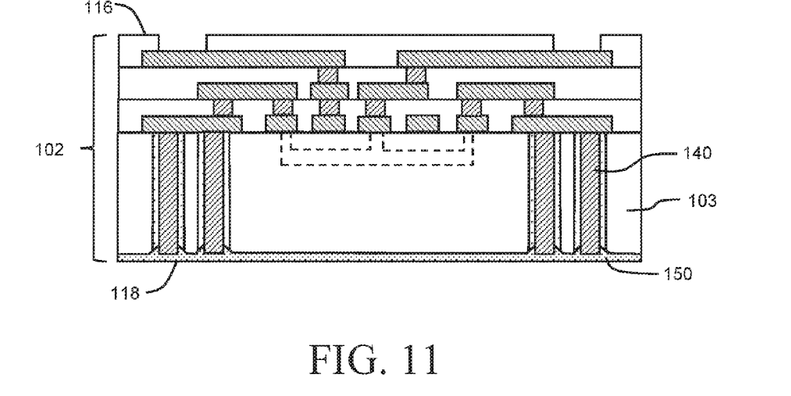
FIG. 11 is a cross-sectional, side view of a semiconductor die that includes a transistor, in accordance with an example embodiment.

The examples illustrated in FIG. 10 assume that the backside metal 150 is deposited on a wafer 300 having a backside profile such as the backside profile of FIG. 5, in which the material of the base semiconductor wafer 303 is recessed more preferentially in proximity to TSVs 140. Those of skill in the art would understand, based on the description herein, that the backside metal 150 embodiments discussed in conjunction with FIG. 10 may be applied also to a wafer 300 having a backside profile such as the backside profile of FIG. 8, as well.

In a first example embodiment corresponding to the enlarged portion of the wafer 300 surrounded by box 1010, layer 150 includes a sintered metallic layer directly connected to the top surface 505 of the base semiconductor wafer 303 and to the exposed ends 143 of the TSVs 140. The sintered metallic layer 1011 can be formed from sinterable material including particulate metal and optionally including flux, polymer binders, distributors, and thinners. The particulate metal can have a particle size in a range of about 10 nanometers (nm) to about 100 microns, such as a range of about 100 nm to about 50 microns or a range of about 1 microns to about 20 microns. In response to sintering, the particles of the sinterable metal and the base semiconductor wafer 303 bind to each other to form a solid structure. In particular, materials of the sinterable metal diffuse across the boundaries of the particles, fusing the particles together and creating one solid piece. In an example, the sintered metallic layer 1011 includes a metal, such as silver, gold, palladium, copper, nickel, or combinations thereof. Besides the metallic particles, the sinterable material may also include non-metallic particulate, such as diamond, silicon carbide, boron nitride, or combinations thereof.

The sinterable material can be applied to the surface 505 of the base semiconductor wafer 303 in the form of a film or of a paste. In an example, the sinterable material can be in the form of a film that is laminated to the surface 505 of the base semiconductor wafer 303. In particular, the film can be laminated to the surface 505 of the wafer 303 using a pressure in a range of about 0.5 megapascals (MPa) to about 5 MPa, such as a pressure range of about 0.5 MPa to about 3 MPa or a pressure in a range of about 1 MPa to about 2 MPa. The film can be laminated to the surface 505 of the wafer 303 at a temperature in a range of about 90 degrees Celsius to about 180 degrees Celsius, such as a temperature in a range of about 110 degrees Celsius to about 170 degrees Celsius or in a range of about 120 degrees Celsius to about 150 degrees Celsius. The temperature and optionally pressure can be applied for a period in the range of about 15 seconds to about 5 minutes, such as a period in a range of about 30 seconds to about 3 minutes, or a range of about 1 minute to about 2 minutes. In another example, the sinterable material can be applied as a paste. For example, the sinterable material can be screen printed or stencil printed onto the surface 505 of the wafer 303.

Whether applied as a film or a paste, the sinterable material can be sintered into a sintered metallic layer. For example, the sinterable material can be sintered at a temperature in a range of about 180 degrees Celsius to about 300 degrees Celsius, such as a temperature in a range of about 200 degrees Celsius to about 280 degrees Celsius, or a temperature range of about 220 degrees Celsius to about 280 degrees Celsius. Optionally, the sinterable material can be pressed during sintering process. For example, a pressure in a range of about 1 MPa to about 25 MPa, such as in a range of about 5 MPa to about 20 MPa or a range of about 4 MPa to about 10 MPa, can be applied while sintering the sinterable material. In particular, sintering can be performed for a period in a range of about 30 seconds to about 10 minutes, such as a period in a range of about 1 minute to about 6 minutes or a range of about 3 minutes to about 4 minutes. In an example, sintering can be performed in a heated press.

The sintered metallic layer 1011 can have a thickness in a range of about 10 microns to about 200 microns. For example, the sintered metallic layer 1011 can have a thickness in a range of about 10 microns to about 150 microns, such as a thickness in a range of about 10 microns to about 50 microns. The sintered metallic layer 1011 can have desirable density, for example, in a range of about 40 percent to about 95 percent, expressed as a percentage relative to the density of the solid constituent metal from which the sintered metallic layer 1011 is formed. For example, the sintered metallic layer 1011 can have a density in a range of about 65 percent to about 95 percent, such as a density in a range of about 65 percent to about 85 percent. Further, the sintered metallic layer 1011 can have a desirable modulus, for example, in a range of about 5 gigapascals (GPa) to about 25 GPa. For example, the modulus can be in a range of about 5 GPa to about 15 GPa, such as a range of about 7 GPa to about 15 GPa. In a further example, the sintered metallic layer 1011 has a desirable coefficient of thermal expansion (CTE), such as in a range of about 4 parts per million per degrees Celsius (ppm/deg C.) to about 20 ppm/deg C. For example, sintered metallic layer 1011 can have a CTE in a range of about 10 ppm/deg C. to about 20 ppm/deg C., such as in a range of about 15 ppm/deg C. to about 20 ppm/C.

In a first multi-layer example embodiment corresponding to the enlarged portion of the wafer 300 surrounded by box 1020, the backside metal 150 may include a plurality of layers 1021-1023 deposited sequentially on the top surface 505 of the base semiconductor wafer 303. More specifically, the backside metal 150 is shown to include three layers 1021-1023. For example, in a specific configuration, the backside metal 150 may include a stackup with a first layer 1021 comprised of titanium (Ti), a second layer 1022 comprised of nickel-vanadium (NiV) or platinum (Pt), and a third layer 1023 comprised of silver (Ag) or gold (Au). Although specific example materials are given for each of layers 1021-1023, other suitable materials may be used in other embodiments.

For example, the first layer 1021 (e.g., Ti) may be deposited in direct contact with the surface 505 of the base semiconductor wafer 303 and the exposed ends 143 of the TSVs 140 using a physical vapor deposition (PVD) process (e.g., sputtering) or a chemical vapor deposition (CVD) process. The second layer 1022 (e.g., NiV or Pt) may be deposited on the first layer 1021 using PVD, CVD, or plating. Finally, the third layer 1023 (e.g., Ag or Au) may be deposited on the second layer 1022 using PVD, or the material of the third layer 1023 may be deposited as a paste or a film.

In a second multi-layer example embodiment corresponding to the enlarged portion of the wafer 300 surrounded by box 1030, the backside metal 150 may include first and second metal layers 1031, 1032 deposited sequentially on the top surface 505 of the base semiconductor wafer 303. For example, in a specific configuration, the backside metal 150 includes a stackup that includes a first layer 1031 comprised of gold (Au), and a second layer 1032 comprised of sintered metal.

In an embodiment, the layer 1031 of gold is deposited in direct contact with the surface 505 of the base semiconductor wafer 303 and the exposed ends 143 of the TSVs 140. For example, the gold layer 1031 may be deposited using a heated physical vapor deposition (PVD) process (e.g., sputtering), or using another suitable technique. Desirably, the deposition process results in the formation of a gold-semiconductor eutectic bond (e.g., a gold-silicon eutectic bond when the base substrate wafer 303 comprises silicon, a gold-GaAs eutectic bond when the base substrate wafer 303 comprises gallium arsenide, or a gold-GaN eutectic bond when the base substrate wafer 303 comprises gallium nitride).

According to an embodiment, the gold layer 1031 is very thin. For example, the gold layer 1021 may have a thickness in a range of about 3 kiloangstroms (kA) to about 25 kA, such as in a range of about 5 kA to about 20 kA. Alternatively, the gold layer 1031 may be thinner or thinner than the above-given ranges.

In an embodiment, the sinterable material forming sintered metallic layer 1032 may be applied directly on the gold layer 1031 in the form of a film or a paste, and the sinterable material may be sintered as described above with respect to layer 1011. As with the previously-described sintered metallic layer 1011, the sintered metallic layer 1032 can be formed from sinterable material including particulate metal and optionally including flux, polymer binders, distributors, and thinners. The various details discussed above in conjunction with the composition and formation of sintered metallic layer 1011 apply equally to the composition and formation of sintered metallic layer 1032, and many of those details are not repeated here for brevity.

The sinterable material of layer 1032 can be applied to the gold layer 1031 in the form of a film or of a paste. In an example, the sintered metallic layer 1032 includes a metal, such as silver, gold, palladium, copper, nickel, or combinations thereof. Besides the metallic particles, the sinterable material may also include non-metallic particulate, such as diamond, silicon carbide, boron nitride, or combinations thereof. The sintered metallic layer 1032 can have a thickness in a range of about 10 microns to about 200 microns, a density in a range of about 40 percent to about 95 percent, a modulus in a range of about 5 GPa to about 25 GPa. and a CTE in a range of about 4 ppm/deg C. to about 20 ppm/deg C., in various embodiments.

Various examples of single-layer and multi-layer configurations for backside metal 150 have been described above. However, other single-layer or multi-layer configurations for backside metal 150 also may be used, in other embodiments. The other multi-layer stackups may include more or fewer layers than the above-described examples, and may include more, fewer, and/or different materials in each layer.

Referring again to FIG. 2, in block 210, the semiconductor wafer 300 may be removed from the carrier 310 and the adhesive 330, and a singulation process may be performed to separate the individual die from the wafer 300. For example, FIG. 11 is a cross-sectional, side view of a semiconductor die 102 that has been singulated from the wafer 300 of FIG. 10, in accordance with an example embodiment. Note that the orientation of die 102 has been flipped with respect to the orientation shown in FIGS. 3-10.

To perform singulation, the semiconductor wafer 300 may be secured to dicing tape, and the die may be separated from the wafer using any appropriate singulation technique (e.g., sawing or another suitable technique). In the above-described process, the backside metal 150 was applied to the semiconductor wafer 300 prior to singulation. In an alternate embodiment, some or all layers of the backside metal 150 may be applied to each individual die after singulation.

Referring again to FIG. 2, in block 212, the singulated die 102 then may be attached to a substrate (e.g., substrate 114, FIG. 1). For example, as discussed previously, a die attach material (e.g., die attach material 112, FIG. 1) may be used to physically and electrically couple a conductive layer (e.g., layer 150, FIGS. 1, 10) on the backside of the die, and thus the protruding TSVs (e.g., TSVs 140, FIGS. 1, 10), to the substrate (e.g., substrate 114, FIG. 1). In various embodiments, the die attach material may include a sintered metallic layer, a solder layer (e.g., a lead-based solder), a conductive adhesive layer (e.g., a conductive epoxy), or another suitable die attach material.

The thickness of the die attach material 112 may be in a range of about 10 microns to about 100 microns, or from about 15 microns to about 40 microns, although the die attach material 112 may be thinner or thicker, as well. When the die attach material is a sintered conductive film or paste, the film or paste may be applied to the surface of the substrate and/or to the backside of the die, the die and the substrate may be brought together, and the sinterable material may be sintered as described above with respect to layers 1011 and 1031. The sinterable die attach material desirably may have density, for example, in a range of about 40 percent to about 95 percent, expressed as a percentage relative to the density of the solid constituent metal from which the sintered die attach material is formed. For example, the sintered die attach material may have a density in a range of about 65 percent to about 95 percent. Further, the sintered die attach material desirably may have a modulus, for example, in a range of about 5 GPa to about 25 GPa. For example, the modulus may be in a range of about 5 GPa to about 15 GPa. In a further example embodiment, the sintered die attach material desirably may have a CTE, in a range of about 4 ppm/deg C. to about 20 ppm/deg C.

Referring again to FIG. 2, in block 214, the electronic device may then be completed. For example, this may include coupling one or more other die and/or devices to the substrate, and electrically connecting the die and other devices to each other and/or to package leads (e.g., with bondwires and/or other types of electrical connections). The die and/or other devices may be enclosed in an air-cavity type of package, or the die and/or other devices may be encapsulated (e.g., in a plastic encapsulant), in various embodiments. The method may then end.

In the embodiments discussed in detail above, a die (e.g., die 102, FIGS. 1, 11) is described as including at least one transistor (e.g., transistor 130, FIG. 1). In other embodiments, instead of or in addition to one or more transistors, a die may include one or more passive components integrated within or coupled to the die. For example, FIG. 12 is a cross-sectional, side view of an electronic assembly 1200 that includes a semiconductor die 1202 that includes a plurality of passive components 1260, 1270, 1280, in accordance with an example embodiment.

As with the various embodiments of die 102, discussed in detail above, die 1202 includes a base semiconductor substrate 1203, a plurality of conductive and dielectric layers overlying one surface of the substrate 1203, and backside metal 1250 composed of one or more conductive layers overlying an opposite surface 1205 of the substrate 1203. In addition, die 1202 includes a plurality of conductive TSVs 1240 extending between the surfaces of the base semiconductor substrate 1203. The semiconductor material of the base semiconductor substrate 1203 may have recessed regions 1210 so that the TSVs 1240 have protruding ends 1243 at the bottom surface 1205 of the substrate 1203, according to various embodiments discussed in detail above.

Figure 12:
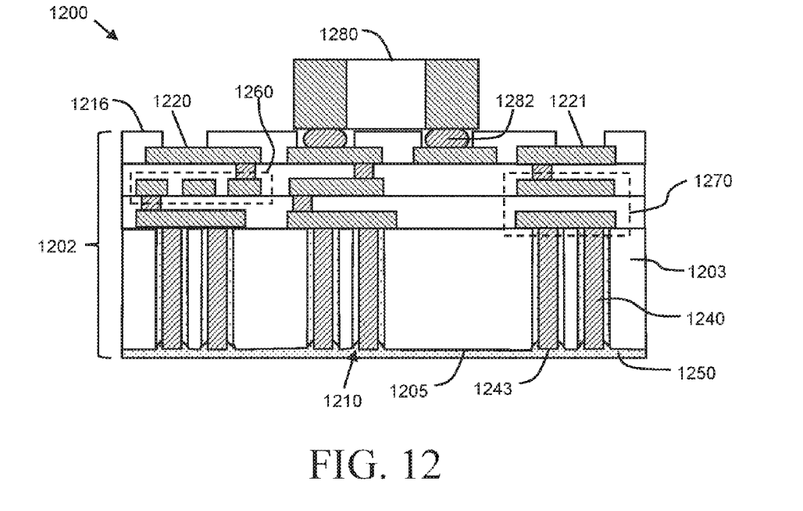
FIG. 12 is a cross-sectional, side view of an electronic assembly that includes a semiconductor die with a plurality of passive devices, in accordance with an example embodiment.

In the embodiment illustrated in FIG. 12, a plurality of passive components 1260, 1270 are integrated within the die 1202. More specifically, the die 1202 includes an integrated spiral inductor 1260, which may be formed from one or more conductive layers. The terminals of the integrated spiral inductor 1260 may be electrically coupled to other conductive features in various ways. For example, one terminal may be electrically coupled to a conductive pad 1220 configured for acceptance of a bondwire or attachment of a discrete device, and another terminal may be electrically coupled to one or more TSVs 1240.

Die 1202 also includes an integrated capacitor 1270, which may include a first electrode (or plate) formed from portions of one or more first conductive layers, a second electrode (or plate) formed from portions of one or more second conductive layers, and dielectric material between the first and second electrodes. The electrodes of the integrated capacitor 1270 may be electrically coupled to other conductive features in various ways. For example, one electrode may be electrically coupled to a conductive pad 1221 configured for acceptance of a bondwire or attachment of a discrete device, and another electrode may be electrically coupled to one or more TSVs 1240.

Further still, one or more discrete components 1280 may be connected and electrically coupled to a top surface 1216 of the die 1202. More specifically, the discrete component(s) 1280 may be connected to exposed conductive pads with solder 1282 or a conductive adhesive. The discrete components may have at least one terminal that is electrically coupled through the build-up layers to one or more TSVs 1240. For example, the discrete components may include chip inductors, chip capacitors, discrete resistors, or virtually any other type of electronic component that is configured for attachment to a semiconductor substrate.

An embodiment of a semiconductor die has a top surface, an opposed bottom surface, a base semiconductor substrate, and an electrically conductive TSV. The base semiconductor substrate includes semiconductor material and has a first surface below the top surface of the semiconductor die, and an opposed second surface. The electrically conductive TSV extends between the first and second surfaces of the base semiconductor substrate. The TSV has a first end proximate to the first surface of the base semiconductor substrate, a second end proximate to the second surface of the base semiconductor substrate, and a TSV sidewall extending between the first and second ends of the TSV. The second surface of the base semiconductor substrate includes a recessed region proximate to the TSV so that the second end of the TSV protrudes from the second surface of the base semiconductor substrate and so that the TSV sidewall has an exposed portion at the second end of the TSV.

An embodiment of an electronic device includes a substrate with a conductive top surface, a semiconductor die, and die attach material. The semiconductor die has a top surface, an opposed bottom surface, a base semiconductor substrate, and an electrically conductive TSV. The base semiconductor substrate includes semiconductor material and has a first surface below the top surface of the semiconductor die, and an opposed second surface. The electrically conductive TSV extends between the first and second surfaces of the base semiconductor substrate. The TSV has a first end proximate to the first surface of the base semiconductor substrate, a second end proximate to the second surface of the base semiconductor substrate, and a TSV sidewall extending between the first and second ends of the TSV. The second surface of the base semiconductor substrate includes a recessed region proximate to the TSV so that the second end of the TSV protrudes from the second surface of the base semiconductor substrate and so that the TSV sidewall has an exposed portion at the second end of the TSV. The die attach material that electrically and physically couples the semiconductor die and the TSV to the conductive top surface of the substrate.

An embodiment of a method of making an electronic device includes removing semiconductor material from a surface of a semiconductor substrate that includes a TSV to produce a recessed region of the semiconductor material proximate to an end of the TSV. The end of the TSV protrudes from the surface of the semiconductor substrate so that a TSV sidewall has an exposed portion at the end of the TSV. The method further includes depositing backside metal on the surface of the semiconductor substrate and in contact with the end of the TSV and the TSV sidewall.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

Note that not all of the activities described above in the general description or the examples are required, that a portion of a specific activity may not be required, and that one or more further activities may be performed in addition to those described. Still further, the order in which activities are listed are not necessarily the order in which they are performed.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, horizontal is a plane parallel to the plane of a major surface of the semiconductor device, regardless of its orientation. Thus, a term "vertical" refers to a direction perpendicular to the horizontal as defined. Terms, such as "above," "below," "top," "bottom," "side" (as in "sidewall"), "upper," "lower," and so forth are defined with respect to the horizontal plane and along the vertical direction. Thus, the orientation of the part itself does not change the relative position denoted by such terms.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A semiconductor die having a top surface and an opposed bottom surface, the semiconductor die comprising:
   a base semiconductor substrate comprising semiconductor material and having a first surface below the top surface of the semiconductor die, and an opposed second surface;
   an electrically conductive through substrate via (TSV) extending between the first and second surfaces of the base semiconductor substrate, wherein the TSV has a first end proximate to the first surface of the base semiconductor substrate, a second end proximate to the second surface of the base semiconductor substrate, and a TSV sidewall extending between the first and second ends of the TSV, and wherein the second surface of the base semiconductor substrate includes a recessed region proximate to the TSV so that the second end of the TSV protrudes from the second surface of the base semiconductor substrate and so that the TSV sidewall has an exposed portion at the second end of the TSV; and
   at least one electrically conductive layer connected to the second surface of the base semiconductor substrate and to the exposed portion of the TSV sidewall, wherein the at least one electrically conductive layer covers an entirety of the second surface of the base semiconductor substrate, including the recessed region.

2. The semiconductor die of claim 1, wherein a majority of the second surface of the base semiconductor substrate extends along a primary plane that is perpendicular to a length of the TSV, and the recessed region is defined by a portion of the second surface that extends from the primary plane to a deepest exposed point on a circumference of the TSV sidewall.

3. The semiconductor die of claim 1, wherein a height of the exposed portion of the TSV sidewall is in a range of 2.0 microns to 15.0 microns.

4. The semiconductor die of claim 1, wherein the TSV comprises a conductive material selected from a group consisting of tungsten, copper, aluminum, silver, and gold.

5. The semiconductor die of claim 1, wherein the at least one electrically conductive layer comprises:

a plurality of layers selected from a group consisting of a titanium layer, a nickel vanadium layer, a gold layer, a silver layer, a palladium layer, a platinum layer, a copper layer, a nickel layer, and any combination thereof.

6. The semiconductor die of claim 1, wherein the semiconductor material of the base semiconductor substrate includes a semiconductor material that is selected from a group consisting of silicon, gallium nitride, and gallium arsenide.

7. The semiconductor die of claim 1, further comprising:
a layer of electrically insulating material between the TSV sidewall and the base semiconductor substrate.

8. The semiconductor die of claim 1, further comprising:
an electrical component coupled to the semiconductor die, wherein the electrical component is selected from a group consisting of a transistor, a capacitor, an inductor, and a resistor; and
at least one conductive layer formed over the first surface of the base semiconductor substrate and electrically connected between the electrical component and the first end of the TSV.

9. The semiconductor die of claim 8, wherein the electrical component is coupled to the semiconductor die in a manner that is selected from being integrally formed within the semiconductor die and being physically connected to the top surface of the semiconductor die.

10. The semiconductor die of claim 1, wherein the at least one electrically conductive layer comprises:
a titanium layer on the surface of the semiconductor substrate; and
a plurality of additional metallic layers over the titanium layer.

11. A semiconductor die having a top surface and an opposed bottom surface, the semiconductor die comprising:
a base semiconductor substrate comprising semiconductor material and having a first surface below the top surface of the semiconductor die, and an opposed second surface; and
an electrically conductive through substrate via (TSV) extending between the first and second surfaces of the base semiconductor substrate, wherein the TSV has a first end proximate to the first surface of the base semiconductor substrate, a second end proximate to the second surface of the base semiconductor substrate, and a TSV sidewall extending between the first and second ends of the TSV, and
wherein an entirety of the second surface of the base semiconductor substrate is recessed below the second end of the TSV so that the second end of the TSV protrudes from the second surface of the base semiconductor substrate and so that the TSV sidewall has an exposed portion at the second end of the TSV.

12. A semiconductor die having a top surface and an opposed bottom surface, the semiconductor die comprising:
a base semiconductor substrate comprising semiconductor material and having a first surface below the top surface of the semiconductor die, and an opposed second surface;
an electrically conductive through substrate via (TSV) extending between the first and second surfaces of the base semiconductor substrate, wherein the TSV has a first end proximate to the first surface of the base semiconductor substrate, a second end proximate to the second surface of the base semiconductor substrate, and a TSV sidewall extending between the first and second ends of the TSV, wherein the second surface of the base semiconductor substrate includes a recessed region proximate to the TSV so that the second end of the TSV protrudes from the second surface of the base semiconductor substrate and so that the TSV sidewall has an exposed portion at the second end of the TSV; and
at least one electrically conductive layer connected to the second surface of the base semiconductor substrate and to the exposed portion of the TSV sidewall, and wherein the at least one electrically conductive layer includes a layer of gold eutectically bonded with the semiconductor material at the second surface of the base semiconductor substrate.

13. A semiconductor die having a top surface and an opposed bottom surface, the semiconductor die comprising:
a base semiconductor substrate comprising semiconductor material and having a first surface below the top surface of the semiconductor die, and an opposed second surface;
an electrically conductive through substrate via (TSV) extending between the first and second surfaces of the base semiconductor substrate, wherein the TSV has a first end proximate to the first surface of the base semiconductor substrate, a second end proximate to the second surface of the base semiconductor substrate, and a TSV sidewall extending between the first and second ends of the TSV, wherein the second surface of the base semiconductor substrate includes a recessed region proximate to the TSV so that the second end of the TSV protrudes from the second surface of the base semiconductor substrate and so that the TSV sidewall has an exposed portion at the second end of the TSV; and
at least one electrically conductive layer connected to the second surface of the base semiconductor substrate and to the exposed portion of the TSV sidewall, and wherein the at least one electrically conductive layer includes a sintered metallic layer coupled to the second surface of the base semiconductor substrate, wherein the sintered metallic layer is selected from a group consisting of silver, gold, palladium, copper, nickel, and any combination thereof.

14. A semiconductor die having a top surface and an opposed bottom surface, the semiconductor die comprising:
a base semiconductor substrate comprising semiconductor material and having a first surface below the top surface of the semiconductor die, and an opposed second surface, wherein the base semiconductor substrate is a high-resistivity substrate with a bulk resistivity that is greater than 1000 ohm/centimeter; and
an electrically conductive through substrate via (TSV) extending between the first and second surfaces of the base semiconductor substrate, wherein the TSV has a first end proximate to the first surface of the base semiconductor substrate, a second end proximate to the second surface of the base semiconductor substrate, and a TSV sidewall extending between the first and second ends of the TSV, wherein the second surface of the base semiconductor substrate includes a recessed region proximate to the TSV so that the second end of the TSV protrudes from the second surface of the base semiconductor substrate and so that the TSV sidewall has an exposed portion at the second end of the TSV.

15. An electronic device comprising:
a substrate with a conductive top surface;
a semiconductor die having
a die top surface,
an opposed die bottom surface,
a base semiconductor substrate comprising semiconductor material and having a first surface below the die top surface, and an opposed second surface, and
an electrically conductive through substrate via (TSV) extending between the first and second surfaces of the base semiconductor substrate, wherein the TSV has a first end proximate to the first surface of the base semiconductor substrate, a second end proximate to the second surface of the base semiconductor substrate, and a TSV sidewall extending between the first and second ends of the TSV, and
wherein the second surface of the base semiconductor substrate includes a recessed region proximate to the TSV so that the second end of the TSV protrudes from the second surface of the base semiconductor substrate and so that the TSV sidewall has an exposed portion at the second end of the TSV; and
die attach material that electrically and physically couples the semiconductor die and the TSV to the conductive top surface of the substrate.

16. The electronic device of claim 15, wherein a height of the exposed portion of the TSV sidewall is in a range of 2.0 microns to 15.0 microns.

17. The electronic device of claim 15, further comprising:
at least one electrically conductive layer connected to the second surface of the base semiconductor substrate and to the exposed portion of the TSV sidewall.

18. The electronic device of claim 17, wherein the at least one electrically conductive layer comprises:
a layer of gold eutectically bonded with the semiconductor material at the second surface of the base semiconductor substrate.

19. The electronic device of claim 17, wherein the at least one electrically conductive layer comprises:
a sintered metallic layer coupled to the second surface of the base semiconductor substrate, wherein the sintered metallic layer is selected from a group consisting of silver, gold, palladium, copper, nickel, and any combination thereof.

20. The electronic device of claim 15, wherein the die attach material is selected from a group consisting of a sintered metallic layer, a solder layer, and a conductive adhesive layer.

21. The electronic device of claim 15, wherein the die attach material is a sintered metallic layer comprising a conductive material selected from a group consisting of silver, gold, palladium, copper, nickel, and any combination thereof.

22. A method of making an electronic device, the method comprising:
removing semiconductor material from a surface of a semiconductor substrate that includes a conductive through substrate via (TSV) to produce a recessed region of the semiconductor material proximate to an end of the TSV, wherein the end of the TSV protrudes from the surface of the semiconductor substrate so that a TSV sidewall has an exposed portion at the end of the TSV; and
depositing backside metal on the surface of the semiconductor substrate and in contact with the end of the TSV and the TSV sidewall, wherein depositing the backside metal includes depositing a gold layer to the surface of the semiconductor substrate, wherein the gold layer forms a eutectic bond with the semiconductor material.

23. The method of claim 22, wherein depositing the backside metal further comprises:
applying a sintered metallic layer to the gold layer.

24. A method of making an electronic device, the method comprising:
removing semiconductor material from a surface of a semiconductor substrate that includes a conductive through substrate via (TSV) to produce a recessed region of the semiconductor material proximate to an end of the TSV, wherein the end of the TSV protrudes from the surface of the semiconductor substrate so that a TSV sidewall has an exposed portion at the end of the TSV; and
depositing backside metal on the surface of the semiconductor substrate and in contact with the end of the TSV and the TSV sidewall, wherein depositing the backside metal includes applying a sintered metallic layer to the surface of the semiconductor substrate.

25. A method of making an electronic device, the method comprising:
removing semiconductor material from a surface of a semiconductor substrate that includes a conductive through substrate via (TSV) to produce a recessed region of the semiconductor material proximate to an end of the TSV, wherein the end of the TSV protrudes from the surface of the semiconductor substrate so that a TSV sidewall has an exposed portion at the end of the TSV; and
depositing backside metal on the surface of the semiconductor substrate and in contact with the end of the TSV and the TSV sidewall, wherein depositing the backside metal includes
applying a titanium layer to the surface of the semiconductor substrate, and
applying a plurality of additional metallic layers over the titanium layer.

26. A method of making an electronic device, the method comprising:
removing semiconductor material from a surface of a semiconductor substrate that includes a conductive through substrate via (TSV) to produce a recessed region of the semiconductor material proximate to an end of the TSV, wherein the end of the TSV protrudes from the surface of the semiconductor substrate so that a TSV sidewall has an exposed portion at the end of the TSV;
depositing backside metal on the surface of the semiconductor substrate and in contact with the end of the TSV and the TSV sidewall; and
attaching the semiconductor substrate to a second substrate by connecting the backside metal to a conductive top surface of the second substrate using a die attach material, wherein the die attach material is selected from a group consisting of a solder, a sintered metallic layer, and a conductive adhesive.

* * * * *